(12) United States Patent  (10) Patent No.: US 7,615,780 B2
Tysoe et al.  (45) Date of Patent: Nov. 10, 2009

(54) DNA BIOSENSOR AND METHODS FOR MAKING AND USING THE SAME

(75) Inventors: Steven Alfred Tysoe, Ballston Spa, NY (US); Eugene Barash, Niskayuna, NY (US); Andrew David Pris, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 362 days.

(21) Appl. No.: 11/427,544

(22) Filed: Jun. 29, 2006

(65) Prior Publication Data

US 2008/0230716 A1 Sep. 25, 2008

Related U.S. Application Data

(63) Continuation-in-part of application No. 10/746,292, filed on Dec. 29, 2003, now Pat. No. 7,102,158, which is a continuation-in-part of application No. 09/694,690, filed on Oct. 23, 2000, now abandoned.

(51) Int. Cl.
    *H01L 23/58* (2006.01)
(52) U.S. Cl. .................................. 257/48; 257/E21.521
(58) Field of Classification Search .................... 257/48
    See application file for complete search history.

(56) References Cited

U.S. PATENT DOCUMENTS

| 5,491,225 | A |   | 2/1996  | Picone et al. |
| 5,578,839 | A |   | 11/1996 | Nakamura et al. |
| 5,637,531 | A |   | 6/1997  | Porowski et al. |
| 5,708,957 | A | * | 1/1998  | Chuang et al. ............ 422/82.07 |
| 5,770,887 | A |   | 6/1998  | Tadatomo et al. |

(Continued)

FOREIGN PATENT DOCUMENTS

JP 2000/022212 1/2000

(Continued)

OTHER PUBLICATIONS

The Handbook—a Guide to Fluorescent Probes And Labeling Technologies; 10the Edition; Chapter 8: Nucleic Acid Detection and Genomics Technology; http://probes.invitrogen.com/handbook/.

(Continued)

*Primary Examiner*—Wai-Sing Louie
(74) *Attorney, Agent, or Firm*—Mary Louise Gioeni

(57) ABSTRACT

Disclosed herein are biosensors and methods for making and using the same. In one embodiment, the sensor for detecting an analyte comprises: a substrate, recognition elements specific for the analyte, an excitation source, a detector, a chamber located between the substrate and the excitation source and between the substrate and the detector, and an emission filter. The recognition elements are tethered to the substrate such that the recognition elements can be exposed to a sample. The excitation source is capable of emitting a first light having a first light peak intensity at a first wavelength, wherein the first light can excite a luminophore to emit a second light when the recognition elements interact with the analyte. The detector is capable of detecting the second light emitted by the luminophore. The emission filter is capable of filtering in a band gap that includes the first light peak intensity.

21 Claims, 10 Drawing Sheets

U.S. PATENT DOCUMENTS

| | | | |
|---|---|---|---|
| 5,810,925 | A | 9/1998 | Tadatomo et al. |
| 5,962,875 | A | 10/1999 | Motoki et al. |
| 5,968,739 | A | 10/1999 | Macioszek et al. |
| 5,981,980 | A | 11/1999 | Miyajima et al. |
| 6,015,979 | A | 1/2000 | Sugiura et al. |
| 6,031,858 | A | 2/2000 | Hatakoshi et al. |
| 6,140,669 | A | 10/2000 | Lozykowski et al. |
| 6,181,721 | B1 | 1/2001 | Geels et al. |
| 6,225,650 | B1 | 5/2001 | Tadatomo et al. |
| 6,255,669 | B1 | 7/2001 | Birkhahn et al. |
| 6,281,526 | B1 | 8/2001 | Nitta et al. |
| 6,294,440 | B1 | 9/2001 | Tsuda et al. |
| 6,316,785 | B1 | 11/2001 | Nunoue et al. |
| 6,362,496 | B1 | 3/2002 | Nanishi et al. |
| 6,413,627 | B1 | 7/2002 | Motoki et al. |
| 6,492,182 | B1 | 12/2002 | Bright et al. |
| 6,582,966 | B2 | 6/2003 | Bright et al. |
| 6,596,079 | B1 | 7/2003 | Vaudo et al. |
| 6,610,848 | B1 * | 8/2003 | Pilato et al. ............ 546/2 |
| 6,680,206 | B1 * | 1/2004 | McDevitt et al. ............ 436/172 |
| 6,686,691 | B1 | 2/2004 | Mueller et al. |
| 6,700,179 | B1 | 3/2004 | Ouchi et al. |
| 6,830,888 | B2 | 12/2004 | Cockerill et al. |
| 6,936,488 | B2 | 8/2005 | D'Evelyn et al. |
| 7,009,215 | B2 | 3/2006 | D'Evelyn et al. |
| 7,053,413 | B2 | 5/2006 | D'Evelyn et al. |
| 7,054,002 | B1 * | 5/2006 | Sevick-Muraca et al. .... 356/317 |
| 7,098,487 | B2 | 8/2006 | D'Evelyn et al. |
| 7,102,158 | B2 * | 9/2006 | Tysoe et al. ............ 257/48 |
| 7,119,372 | B2 | 10/2006 | Stokes et al. |
| 7,122,827 | B2 | 10/2006 | Alizadeh et al. |
| 7,125,453 | B2 | 10/2006 | D'Evelyn et al. |
| 2004/0195598 | A1 | 10/2004 | Tysoe et al. |

FOREIGN PATENT DOCUMENTS

| | | | |
|---|---|---|---|
| WO | WO 01/09604 | A1 | 2/2001 |
| WO | 0124285 | A1 | 4/2001 |
| WO | 0137351 | A1 | 5/2001 |

OTHER PUBLICATIONS

Pelzmann et al., "Blue Light/Emitting Diodes on GaN Substrates, Growth and Characteriza/Tion"; Journal of Crystal Grown 189/190 (1998) 167/171.

Kamp et al.; "GaN Homoepitaxy for Device Applications"; MRS internet J. Nitride Semicond. Res. 4S1, G10.2 (1999).

Porowski; "High Pressure Crystallization of III/V itrides"; ACTA Physics Polonica A, vol. 87 (1995).

Webster, J.R., et al.; "Monolithic Capillary Electrophoresis Device with Integrated Fluorescence Detector"; Center for Integrated Microsystems; Department of Electrical Engineering and Computer Science; Department Of chemical Engineering; Department of Genetics; University of Michigan, Ann Arbor MI 48109/2122, USA; Apr. 16, 2000.

U.S. Appl. No. 09/683,658, filed Jan. 31, 2002.

Bertram et al., "Strain Relaxation and Strong Impurity Incorporation in Epitaxial Laterally Overgrown GaN: Direct Imaging of Different Growth Domains by Cathodoluminescence Microscopy and Micro-Raman Spectroscopy"; Applied Physics Letters, vol. 74, No. 3, pp. 359-361, Jan. 18, 1999.

Fini et al., "In Situ, Real-Time Measurement of Wing Tilt During Lateral Epitaxial Overgrowth of GaN"; Applied Physics Letters, vol. 76, No. 26, pp. 3893-3894, Jun. 26, 2000.

Fini et al., "Determination of Tilt in the Lateral Epitaxial Overgrowth of GaN Using X-Ray Diffraction"; Journal of Crystal Growth, vol. 209, pp. 581-590, 2000.

Honda et al., "Crystal Orientation Fluctuation of Epitaxial-Lateral-Overgrown GaN with W Mask and $SiO_2$ Mask Observed by Transmission Electron Diffraction and X-Ray Rocking Curves", Japanese Journal of Applied Physics, vol. 38, Part 2, No. 11B, pp. L1299-L1302, Nov. 15, 1999.

Horibuchi et al., "Behavior of Threading Dislocations in SAG-GaN Grown by MOVPE"; Threading Dislocations in SAG-GaN, Phys. Stat. Sol. (a), vol. 180, pp. 171-175, 2000.

Kim et al., "Crystal Tilting in GaN Grown by Pendoepitaxy Method on Sapphire Substrate"; Applied Physics Letters, vol. 75, No. 26, pp. 4109-4111, Dec. 27, 1999.

Kuan et al., "Dislocation Mechanisms in the GaN Lateral Overgrowth by Hydride Vapor Phase Epitaxy"; F99W2.6, pp. 1-6.

Marchand et al., "Microstructure of GaN Laterally Overgrown by Metalorganic Chemical Vapor Depostition"; vol. 73, No. 6, pp. 747-749, Aug. 10, 1998.

Sakai et al., "Transmission Electron Microscopy of Defects in GaN Films Formed by Epitaxial Lateral Overgrowth"; vol. 73, No. 4, pp. 481-483, Jul. 27, 1998.

Song et al., "Lateral Epitaxial Overgrowth of GaN and Its Crystallographic Tilt Depending on the Growth Condition"; Lateral Epitaxial Overgrowth of GaN, Phys. Stat. Sol. (a), vol. 180, pp. 247-250, 2000.

Tomiya et al., "Dependence of Crystallographic Tilt and Defect Distribution on Mask Material in Epitaxial Lateral Overgrown GaN Layers"; Applied Physics Letters, vol. 77, No. 5, pp. 636-638, Jul. 31, 2000.

Van de Walle, Chris G., "Interactions of Hydrogen with Native Defects in GaN"; Rapid Communications, Physical Review B, vol. 56, No. 16, pp. R10 020-R10 023, Oct. 15, 1997.

Weinstein et al., "Hydrogen-Decorated Lattice Defects in Proton Implanted GaN"; Applied Physics Letters, vol. 72, No. 14, pp. 1703-1705, Apr. 6, 1998.

Vaudo et al., "GaN Boule Growth: A Pathway to GaN Wafers with Improved Material Quality"; Phys. Stat. Sol. (a), vol. 194, No. 2, pp. 494-497, 2002.

Yasan et al., "Comparison of Ultraviolet Light-Emitting Diodes with Peak Emission at 340nm Grown on GaN Substrate and Sapphire"; Applied Physics Letters, vol. 81, No. 12, pp. 2151-2153, Sep. 16, 2002.

Grzegory et al., "Blue Laser on High $N_2$ Pressure-Grown Bulk GaN"; ACTA Physica Polonica A, vol. 100, pp. 229-232, 2001.

Prystawko et al., "Blue-Laser Structures Grown on Bulk GaN Crystals"; Phys. Stat. Sol (a), vol. 192, No. 2, pp. 320-324, 2002.

Porowski et al., "High Resistivity GaN Single Crystalline Substrates"; ACTA Physica Polonica A, vol. 92, No. 5, pp. 958-962, 1997.

Pankove et al., "Molecular Doping of Gallium Nitride"; Applied Physics Letters, vol. 74, No. 3, pp. 416-418, Jan. 18, 1999.

* cited by examiner

DNA BIOSENSOR AND METHODS FOR MAKING AND USING THE SAME

CROSS REFERENCE TO RELATED APPLICATIONS

This application is a continuation-in-part application of U.S. patent application Ser. No. 10/746,292, filed Dec. 29, 2003, which is a continuation-in-part application of U.S. patent application Ser. No. 09/694,690, filed Oct. 23, 2000, now abandoned, both of which are hereby incorporated by reference in their entirety.

STATEMENT OF FEDERALLY FUNDED RESEARCH

This invention was made with Government support under contract number W911SR-05-C-0003 by the United States Army RDECOM. The Government has certain rights in the invention.

BACKGROUND

There is a need for analyte detection that combines the speed and sensitivity of light-based sensors with the high specificity of biomolecular assays such as nucleic acid hybridization assays. In applications ranging from metabolic diagnostics to detection of pathogenic organisms, biomolecules are typically detected through either nucleic acid amplification or antibody recognition. Signaling is usually accomplished by attaching luminescent labels to probes. These conventional tests are typically difficult to multiplex and require equipment that is bulky, intricate and expensive.

Bright et al. describe a microsensor array comprising a sensor located in microwells on the top surface of a light emitter, for example, an LED. See Bright et al, U.S. Pat. No. 6,492,182, filed Jul. 28, 2000, issued Dec. 10, 2002, and U.S. Pat. No. 6,582,966, filed Jun. 24, 2003. Bright et al. disclose a sensor that is physically embedded in sol-gel glass inside the microwells. The sol-gel glass has a surface area of approximately 100 square meters per gram ($m^2/g$) and pores approximately 0.5-500 nanometers (nm) in diameter. The use of microwells complicates manufacture of the detection device. Moreover, the nano-pores in the glass impede or prevent in-diffusion when the analytes are biomolecules such as nucleic acids.

SUMMARY

Described herein are sensors, as well as methods for making and using the same.

In one embodiment, the sensor for detecting an analyte comprises: a substrate, recognition elements specific for the analyte, an excitation source, a detector, a chamber located between the substrate and the excitation source and between the substrate and the detector, and an emission filter. The recognition elements are tethered to the substrate such that the recognition elements can be exposed to a sample. The excitation source is capable of emitting a first light having a first light peak intensity at a first wavelength, wherein the first light can excite a luminophore to emit a second light when the recognition elements interact with the analyte. The detector is capable of detecting the second light emitted by the luminophore. The emission filter is located between the detector and the chamber and is capable of filtering in a band gap that includes the first light peak intensity and excludes at least a portion of the second light band.

In one embodiment, a method for sensing an analyte comprises: introducing a sample to a chamber in the sensor, exposing the recognition elements to the sample, emitting the first light to excite the luminophore to emit a second light if the analyte is present in the sample, and determining if the second light is emitted.

The above-described and other features will be appreciated and understood from the following detailed description, drawings, and appended claims.

DETAILED DESCRIPTION

Figure 1:
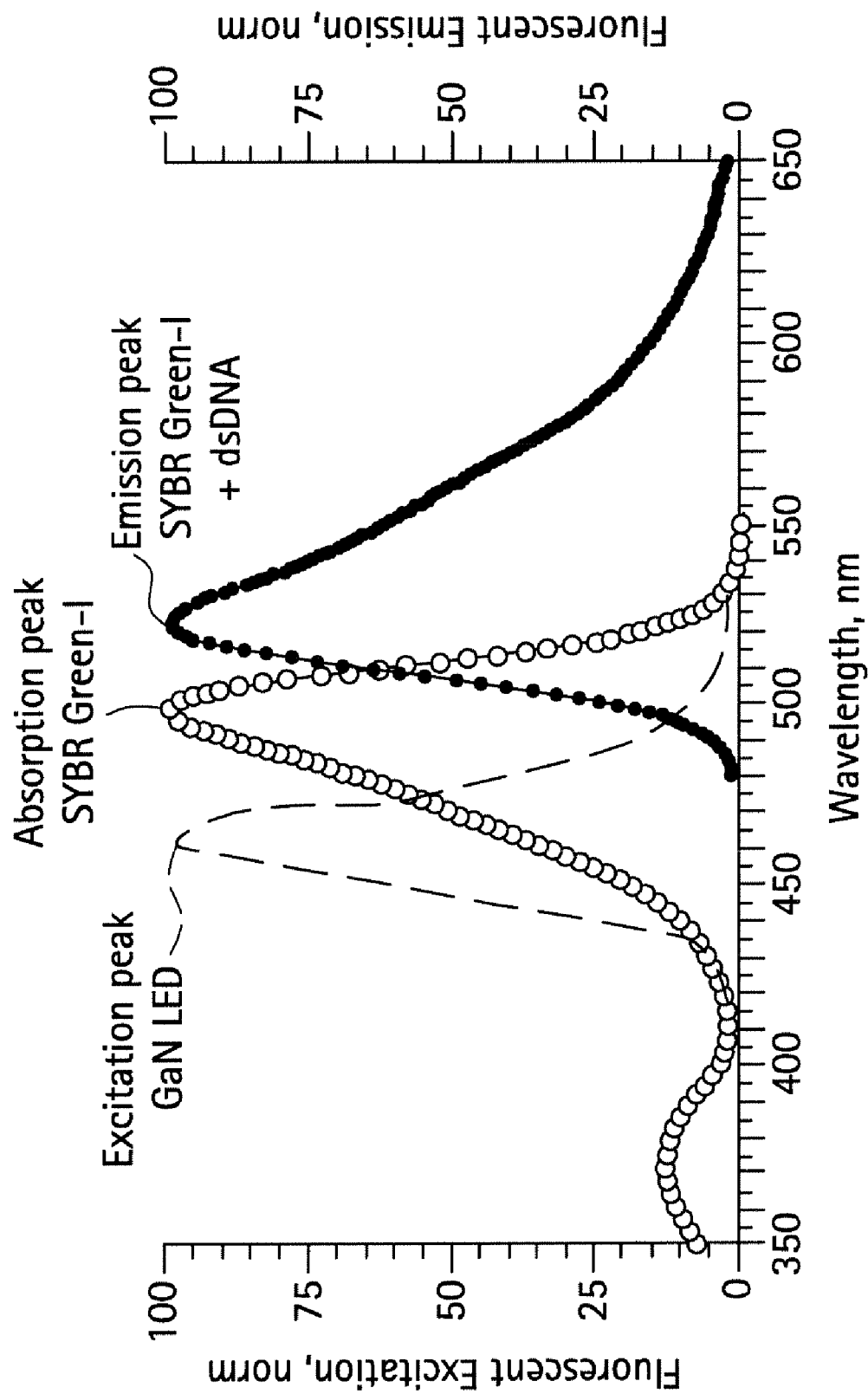
FIG. 1 shows the emission intensity of a commercially available GaN-based LED as a function of wavelength, with a peak emission wavelength of 473 nm, and with SYBR Green I absorption and emission spectra with peaks at 500 nm and 522 nm correspondingly. (A portion of the FIG. 1 is from *The Handbook—A Guide to Fluorescent Probes and Labeling Technologies. Invitrogen*, $10^{th}$ Edition, Chapter 8, FIG. 8.77.)

Recognition elements are attached to a surface of the device that is exposed to the sample. In one embodiment, the recognition elements are single stranded nucleic acids (ssDNA) specific for one or more analytes or produced by an organism of interest, and little or no signal is detected when only DNA or RNA from organisms other than the target are present. The recognition elements can be attached directly or indirectly to the surface via covalent and/or ionic bonds that remain substantially stable throughout the assay procedures, or, more specifically, the surface to which the recognition elements are attached is a surface of the excitation source. The surface of the excitation source may be bare, in which case the recognition elements are covalently and/or ionically bound directly to the substrate material of the excitation source itself. Alternatively, the surface of the excitation source may include a coating (such as gold), a matrix (such as sol-gel, hydrogel (e.g., a three-dimensional hydrogel matrix)), and/or the like, that is bound to the excitation source, in which case the recognition elements are covalently or ionically bound to the coating or matrix. When the recognition elements are nucleic acids, it is beneficial for the covalent or ionic bonds between the recognition elements and the surface to be stable from at about 0° C. to at least about 100° C.

The sensor can be employed in combination with luminophores that absorb light from the excitation source and that first emit light, or that emit light with a different characteristic, when the recognition elements interact with the analyte. For example, if a target nucleic acid is present in the sample, and if the target binds to the recognition elements to form DNA, RNA, and/or RNA/DNA hybrids, then the luminophores will first emit light or will emit light that differs detectably from the light that they emit when the analyte is not bound to the recognition elements.

In some embodiments, the luminophores (or complexes of luminophores and intercalator-type agents) are free in the sample solution. When the recognition elements and the analyte interact with each other to form recognition element-analyte complexes, the luminophores associate with the recognition element-analyte complexes. In another embodiment, the luminophores are initially bound to the recognition elements, or bound to the recognition elements at least prior to interaction between the recognition elements and the analyte (e.g., before duplex formation). The luminophores (or luminophore-intercalator complexes) can be tethered to the same surface as the recognition elements, e.g., tethered to the surface via relatively flexible molecules (e.g., alkyl chains) that are long enough to allow the luminophores to associate with the recognition element-analyte complexes.

The ssDNA recognition elements can be bound to a surface of a GaN-based LED or another source of UV or visible light, or to a substrate (e.g., a gold substrate) that is in optical communication with a light source (e.g., the LED). Surface attachment of the ssDNA recognition elements can be achieved by sputter coating the surface with gold and by tethering the ssDNA recognition elements to the gold coating via thiolated 5' ends on the ssDNA, or by tethering the ssDNA recognition elements to the gold substrate via thiolated 5' ends on the ssDNA. The tethered ssDNA recognition elements can be placed in a buffer solution containing ssDNA from a target organism and an appropriate luminescent dye which binds to dsDNA. When the target ssDNA and the recognition element ssDNA hybridize to form a duplex, the dye becomes associated with the duplex via intercalation or groove binding, which alters the conformation of the dye causing it to luminesce when excited by light emitted by the LED. The luminescence can be detected by an integral photodetector or the LED can be removed from the solution and the luminescence can be detected by eye, CCD detector, scanner, or with a fluorimeter or similar apparatus.

The excitation source, recognition elements, luminophores and other features may be present as discrete elements or as an array of elements. Simultaneous detecting and/or monitoring different analytes in a two-dimensional array can be accomplished. (As used herein, "array" includes microarray and nanoarray.)

Various embodiments of the device include: a surface to which recognition elements may be bound, an excitation source that emits electromagnetic radiation (e.g., light) capable of being absorbed by luminophores. The recognition elements specific for the analyte and bound to the device may include: luminophores that are free in solution, bound to the recognition elements, and/or tethered to the surface. Additionally, the device, which may also include optical filter(s) and/or photodetector(s), can be used to qualitatively and/or quantitatively detect and/or monitor various types of analytes, reactions, and/or interactions.

The recognition elements can be attached through covalent and/or ionic bonds to a surface of the device or kit that is exposed to the sample. The recognition elements may be attached directly and/or attached via a coating to the surface, such as a sputtered coating (e.g., of gold) that facilitates attachment of the recognition elements.

The surface can include channel(s), trough(s), and/or the like, through which sample or analyte may flow and bind to recognition elements bound therein. Additionally, the surface can be roughened, e.g., to increase the surface area or the quantity of adsorbed recognition element, thereby increasing sensitivity. The surface can be non-porous (e.g., including no gel or porous matrix material), can have a low surface area (such as less than or equal to about 0.01 $m^2/g$, e.g., so as not to impede transport of molecules to the recognition element), and/or can be smooth and planar (i.e., including no microwells).

The recognition elements can be attached through covalent and/or ionic bonds to a surface of the excitation source that faces the sample. The recognition elements may be attached directly and/or indirectly (e.g., via a coating) to the excitation source. The coating should be sufficiently thin or otherwise transmissive enough to substantially permit light emitted by the excitation source to pass therethrough. As used herein, "light" is not limited to visible or UV light and should be understood as being interchangeable with "electromagnetic radiation", except where specifically indicated otherwise.

The recognition elements can be isolated from each other by laying down a grid over the surface to which the recognition elements are attached such that the excitation source emits light between the grid lines. The grid can comprise an inert material (such as a metal (e.g., aluminum), alumina, garnet, and/or sapphire) that is opaque to the emitted electromagnetic radiation.

The excitation source can have a "flip-chip" configuration wherein the epitaxial (cladding) layers are separated from the sample solution by the substrate on which they are grown. In other words, the epitaxial layers are on the bottom of the substrate rather than on the top of the substrate. As such, in a flip-chip embodiment in which the recognition elements are bound to the surface of the excitation source, the substrate portion of the excitation source is interposed between the sample solution and the epitaxial layers of the excitation source. The separation of the electrical contacts of the epitaxial layers from the sample solution prevents short circuits. It also allows heat to dissipate from the epitaxial layers away from the immediate proximity of the bound recognition elements, thereby preventing such heat from altering the hybridization conditions.

Figure 2:
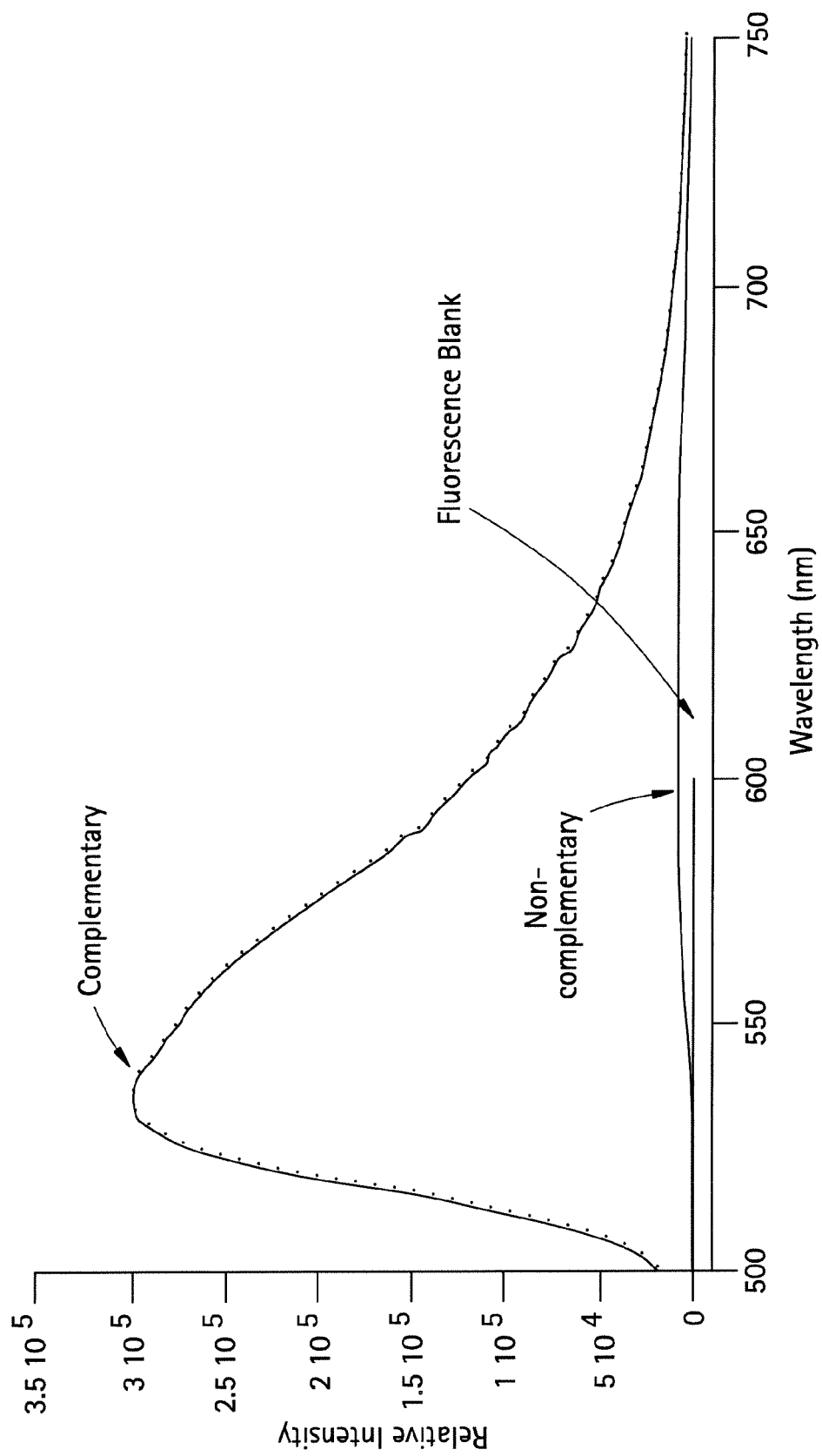
FIG. 2 shows a fluorescence signal generated by hybridization of complementary ssDNA molecules in the presence of SYBR Green I. A non-complementary ssDNA molecule and a fluorescence blank is shown for comparison purposes.

In some embodiments, the excitation source emits monochromatic light or light for which the full width at half maximum (FWHM) of the emission spectrum is less than about 10% of the peak wavelength. FIG. 1 shows the emission intensity of a commercially available GaN-based LED as a function of wavelength, with peak emission wavelength of 473 nm. The FWHM is less than or equal to 10%, and the emission intensity at 473 nm is a suitable wavelength to allow for absorption and subsequent luminescence from the luminophore at wavelengths longer than 480 nm. FIG. 2 shows a fluorescence signal generated by hybridization of complementary ssDNA molecules in the presence of SYBR Green I. A non-complementary ssDNA molecule and a fluorescence blank is shown for comparison purposes.

If the light emitted by the excitation source has significant intensity at the same wavelength as the light emitted by the luminophores when the recognition elements interact with the analyte, the light emitted by the excitation source constitutes a background signal that reduces sensitivity. This background signal from the excitation source may be mitigated or eliminated in several ways. For example, using a GaN-based vertical cavity surface emitting laser (VCSEL) or a resonant cavity LED (RCLED) will both narrow the spectrum of excitation light and reduce off-resonance light emission. The LED can incorporate a resonant cavity design in order to further increase the ratios of the intensities at the excitation and detection wavelengths, as described by Song et. al. [Appl. Phys. Lett. 77, 1744 (2000)].

The excitation source can be a homoepitaxial GaN-based light emitting diode (LED) and/or resonant cavity device having minimal threading dislocations in the substrate (e.g., to reduce emission of yellow light). Such homoepitaxial GaN-based LEDs and resonant cavity devices are described below in detail and are also disclosed in U. S. Pat. No. 7,009,215, issued Mar. 7, 2006 to D'Evelyn et al. and U.S. patent application Ser. No. 09/694,690, both of which are incorporated by reference herein in their entireties.

The homoepitaxial LED can comprise a light emitting semiconductor active region disposed on a substrate comprised of GaN having a dislocation density less than or equal to $10^5$ per square centimeter ($cm^2$), or, more specifically, less than or equal to $10^3$ per $cm^2$. The homoepitaxial light emitting diode can comprise a n-electrode, a n-GaN substrate, a n-GaN or n-$Al_wGa_{1-w}N$ cladding layer, an $In_xGa_{(1-x)}N$ active layer, a p-$Al_yGa_{(1-y)}N$ cladding layer, a p-GaN cladding layer, and a p-electrode, wherein $0 \leq w,x,y \leq 1$.

The resonant cavity light emitting device can comprise a stack of Group II nitride layers, including an active region. A single crystal gallium nitride substrate on which the stack of Group III nitride layers is disposed is substantially free of tilt boundaries. The single crystal gallium nitride (GaN) substrate has a dislocation density less than $10^4$ $cm^{-2}$. First and second mirrors define a resonant cavity inside of which the active region is disposed. Light produced by the active region resonates in the resonant cavity.

In some embodiments, the GaN substrate is a (0001)-oriented GaN wafer cut from a boule that was grown using a supercritical solvent at a temperature greater than or equal to about 550° C. and under a pressure of greater than about 5 kilobar (kbar).

One process for forming the GaN substrate comprises providing a source gallium nitride, solvent, and mineralizer. The source gallium nitride can comprise poorly-crystallized gallium nitride, well-crystallized gallium nitride, amorphous gallium nitride, polycrystalline gallium nitride, and combinations comprising at least one of the foregoing. The source gallium nitride may be provided "as-is" in its raw form. Alternatively, the source gallium nitride can be compacted into a "pill" and/or sintered into a polycrystalline compact. Alternatively, the source gallium nitride can be formed in situ. Gallium metal may be provided, which then reacts with the ammonia solvent after sealing of the capsule and treatment at high pressure and high temperature to form source gallium nitride.

The source gallium nitride can then be combined with the mineralizer and/or the solvent to form a mixture. Optionally, the gallium nitride, solvent, and mineralizer can be provided individually to the capsule as separate and distinct un-combined materials. The mixture, comprising the gallium nitride and also comprising solvent and/or mineralizer, can optionally be compacted into a pill.

The source gallium nitride, solvent, and mineralizer, whether as a mixture that is compacted or not compacted, are then placed inside a capsule. Optionally, additional mineralizer can be added to the capsule. The capsule can then be filled with a solvent such as a nitrogen-containing solvent (for example ammonia and/or hydrazine), an organic solvent (for example, methylamine, melamine, and/or ethylene diamine), and combinations comprising at least one of the foregoing solvents. The capsule is then sealed, disposed in a pressure cell, and subjected to high pressure (e.g., greater than or equal to about 1 kbar) and high temperature (e.g., greater than or equal to about 550° C.) conditions in an appropriate high pressure high temperature (HPHT) system. The HPHT conditions are maintained for a length of time sufficient to dissolve the source gallium nitride and re-precipitate it onto a gallium nitride crystal, gallium nitride boule, and/or gallium nitride crystal seed.

Maintaining HPHT conditions yields large single gallium nitride crystals, for example single gallium nitride crystals having a diameter, as measured along a major axis, of about 0.02 inch (about 0.05 cm) to about 12 inches (about 30 cm), or, more specifically, about 2 inches (about 5 cm) to about 6 inches (about 15 cm). The pressure can be greater than or equal to about 5 kbar, or, more specifically, about 5 kbar to about 80 kbar. The temperature for the gallium nitride crystal growth process is about 550° C. to about 3,000° C. The GaN single crystals thus formed are substantially transparent, with an absorption coefficient below 100 $cm^{-1}$. Furthermore, the substrates have carrier mobilities above about 100 square centimeters volt seconds ($cm^2$ V-s) and strain, with respect to undoped GaN homoepitaxial layers, below about 0.005%.

The HPHT system is then cooled (actively and/or passively) and the high pressure is relieved. The gallium nitride crystals removed from the HPHT system and pressure cell can be washed in water and mineral acids. The mineral acids for washing the gallium nitride crystals include, but are not limited to, hydrochloric acid (HCl) and nitric acid ($HNO_3$).

Possible mineralizers comprise alkali and alkaline-earth nitrides (such as $Li_3N$, $Mg_3N_2$, and $Ca_3Na_2$), amides (such as $LiNH_2$, $NaNH_2$, and $KNH_2$), urea and related compounds, ammonium salts (such as $NH_4F$ and $NH_4Cl$), halide salts, sulfide salts, and nitrate salts (such as NaCl, $CeCl_3$, $Li_2S$, and $KNO_3$), lithium salts, as well as combinations comprising at least one of the foregoing mineralizers. The mineralizers can be provided as solids or as additives dissolved in fluids, such as solvents. The use of alkaline-earth or rare-earth mineralizers have the additional advantage of acting as a getter for adventitious oxygen in the growth medium, allowing for the growth of undoped GaN crystals with low n-type carrier density. Alternatively, or in addition, the mineralizer can be formed in situ. For example, lithium, sodium, potassium, rubidium, cesium, magnesium, calcium, strontium, barium, and/or a rare-earth metal can be provided, which then react with the ammonia solvent to form the mineralizer.

The filling and sealing portion of making the GaN substrate will now be described. The capsule is filled with a nitrogen-containing solvent, without admitting air or water, which are undesirable in the gallium nitride formation process. To fill the capsule without admitting air or water, the capsule is filled and connected to a negative pressure source, such as a vacuum manifold, and evacuated. The capsule is then chilled to a temperature below room temperature (e.g., about −72° C. or below) and vapor-phase solvent is admitted to the manifold. The vapor-phase solvent condenses in the capsule. For example, if the nitrogen-containing solvent comprises ammonia, the condensation can be performed at dry ice or liquid-nitrogen temperatures.

The capsule can then be isolated so as to seal the capsule by closing a valve to the negative pressure source. The capsule can be separated from the manifold and/or the valve by a pinching-off step using a cold welding apparatus. The pinching-off step is particularly effective if the capsule is copper. Optional arc welding may enhance the integrity of the seal.

The capsule and pressure cell comprise any appropriate form that permit the gallium nitride growth process to withstand the high pressure and high temperature employed during the process. The HPHT system can comprise a press device, which may include a die and/or punch. For example, the press device can comprise a piston-cylinder press; a belt press; a tetrahedral-, cubic-, or octahedral-anvil press; a recessed-anvil press; and a toriod-type press; as well as combinations comprising at least one of the foregoing.

After the crystal has been formed, the substrate is cut from the boule formed by the method described above. The wafer comprises n-type GaN, with an electrical resistivity less than or equal to about 1,000 ohm centimeters ($\Omega$-cm), or, more specifically, less than or equal to about 100 $\Omega$-cm, or even more specifically, less than or equal to about 10 $\Omega$-cm. The substrate can then be polished to a mirror finish using mechanical-polishing techniques. Subsurface damage that remains after the polishing process can be removed by several methods including chemically assisted ion beam etching and/or chemo-mechanical polishing. The residual damage can also be removed by heating the substrate to a temperature of about 900° C. to about 1,500° C. in an atmosphere containing ammonia at a partial pressure of about 10-8 millibar (mbar) to about 20,000 bar. The substrate thickness can be controlled by the process. For example, the substrate thickness can be greater than or equal to about 0.001 millimeters, or, more specifically, about 0.01 millimeter (mm) to about 10 mm, or, even more specifically, about 0.05 mm to about 5 mm. The substrate can be a wurtzite-structure material. More specifically, the (0001)-oriented GaN substrates will have a Ga-terminated (000$\bar{1}$) face and an N-terminated (000$\bar{1}$) face. It is expected that the (0001) Ga face will be superior for deposition of LED and LD structures.

To begin fabrication of the LED, the GaN substrate is placed in a growth reactor which is then evacuated. Residual surface defects are annealed, and/or adventitious contaminants removed, by heating the substrate to a temperature of about 900° C. to about 1,200° C. in an atmosphere containing ammonia at a partial pressure of about $10^{-6}$ mbar to about 1 bar. The active LED structure is fabricated by metal organic vapor-phase epitaxy (MOVPE) and/or by molecular beam epitaxy (MBE).

Figure 3:
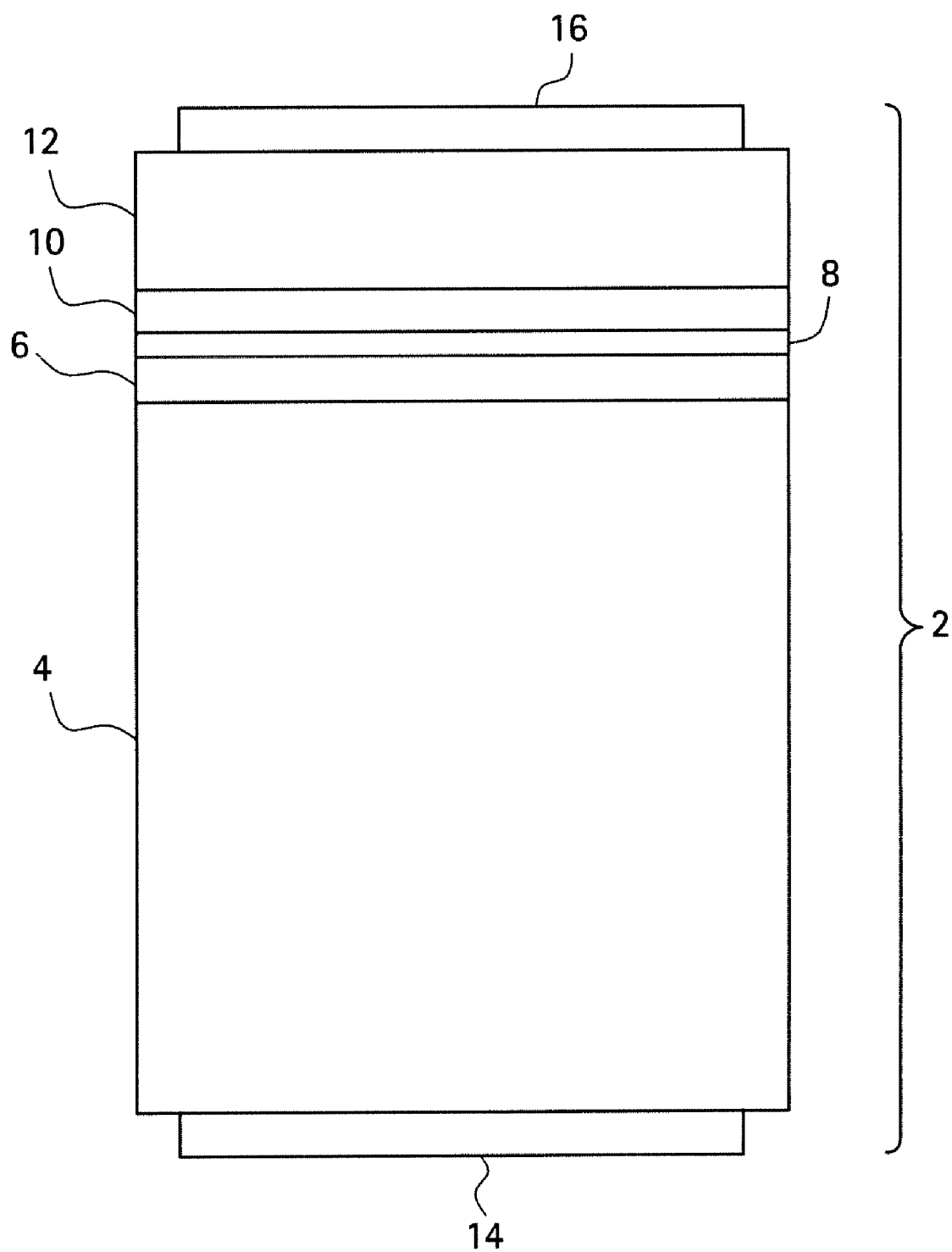
FIG. 3 illustrates the structure of an embodiment of an excitation source, a homoepitaxial light emitting diode (LED).

FIG. 3 illustrates the structure 2 of an exemplary homoepitaxial LED. A GaN wafer 4 is shown as the substrate upon which the LED is formed. The structure 2 may be formed by decomposition of organometallic precursors in an ammonia-containing atmosphere on the substrate 4 surface. A carrier gas, such as hydrogen and/or helium, can be used. Exemplary organometallic precursors include trimethylgallium, trimethylaluminum, trimethylindium, and combinations comprising at least one of the foregoing. Suitable dopant precursors include silane for n-type material, and bis-(cyclopentadienyl) magnesium and/or dimethyl zinc for p-type material.

After the substrate 4 has been annealed, a cladding layer 6 of n-type GaN or $Al_wGa_{(1-w)}N$, where $0 \leq w \leq 1$, Zis optionally formed on the surface of the substrate 4. The n-type GaN or $Al_wGa_{(1-w)}N$ cladding layer 6 has a thickness of about 1 nanometers (nm) to about 10 micrometers ($\mu$m), or, more specifically, about 0.1 $\mu$m to about 4 $\mu$m. The deposition of the n-type GaN or $Al_wGa_{(1-w)}N$ cladding layer 6 may lead to improved electrical properties relative to the substrate itself, a different doping level and electrical conductivity, and/or a higher bandgap.

An active layer 8 can then be deposited on the optional cladding layer 6, in the absence of the cladding layer 6, on the substrate 4. The active layer 8 can comprise $In_xGa_{(1-x)}N$, where $0 \leq x \leq 1$. As x varies from 0 to 1, the bandgap varies between 3.4 and 2.0 electron volt (eV), allowing for light emission between the ultraviolet and amber regions of the electromagnetic spectrum. Typically, x will be about 0.025 to about 0.6, or more particularly, about 0.05 to about 0.5. The active layer may be undoped, n-type doped with impurities such as Si and/or Ge, or p-type doped, with impurities such as Zn and/or Mg. It may comprise a single layer, as in so-called double heterostructure or single quantum-well structures, or it may consist of a superlattice of $In_xGa_{(1-x)}N$ and $In_yGa_{(1-y)}N$, where $0 \leq y \leq x$, in so-called multiple-quantum well structures. The superlattice can comprise about 1 to about 50 alternating layers of the two different compositions of InGaN, with the more In-rich layers (lower bandgap) forming the well and the less In-rich layers (higher bandgap) forming the barrier. Each individual layer may have a thickness of about 0.5 nm to about 50 nm. The well and barrier layers may be undoped, n-type, or p-type doped. In one embodiment, the structure comprises undoped well layers, and n-type doped or undoped barrier layers. InN and $In_xGa_{(1-x)}N$ decompose at a temperature lower than does GaN. Therefore, these layers should be deposited at temperatures of about 500° C. to 1,200° C., or, more specifically, about 650° C. to 1,050° C.

If the active layer is n-type doped, and relatively thick (e.g., about 50 nm to about 500 nm), the LED would have a double-heterostructure, particularly if the n-type cladding layer 6 comprises $Al_wGa_{(1-w)}N$ rather than GaN. If the active layer is undoped and relatively thin (e.g., about 1 to about 10 nm), the LED would be a single quantum well, particularly if an additional n-$Al_wGa_{(1-w)}N$ cladding layer and a n-$In_yGa_{(1-y)}N$ barrier layer, with y<x, were positioned between the n-GaN layer 6 and the active layer 8.

Cladding layer(s) can optionally be disposed around the active layer 8. As shown in FIG. 3, these cladding layers 10, 12 comprise p-type cladding layers. Cladding layer 10 can comprise $Al_zGa_{(1-z)}N$, wherein $0 \leq z \leq 1$, and cladding layer 12 can comprise p-GaN. The cladding layers 10, 12 have a larger bandgap than that of the active layer 8, and are useful for confining the electrical carriers and, in the case of laser diodes, of favorably directing light emission in the desired directions. The cladding layers 6, 10, and 12, can be deposited at temperatures of about 600° C. to about 1,500° C., or, more specifically, about 850° C. to about 1,200° C.

One common impurity in GaAlInN LEDs is hydrogen. In the case of p-type material, the hydrogen may complex with acceptor centers and cause the resistivity to be high, thereby degrading performance. The hydrogen-acceptor complexes can be dissociated by annealing at a temperature above about 400° C., or their formation can be avoided in the first place by use of a hydrogen-free growth environment, such as argon, nitrogen, or vacuum. In the absence of hydrogen, the resistivity of the p-type layers can be below about $10^5$ $\Omega$-cm.

In the next step in the formation of the light emitting diodes, metallic contacts 14, 16 can be formed on the top (p-type) and bottom (n-type) surfaces. Most of the area of the p-type contact 16 is very thin (e.g., about 0.001 μm to about 1 μm thick), so as to be substantially optically transparent. Suitable compositions for the p-type contact 16 include nickel (Ni), palladium (Pd), platinum (Pt), gold (Au), aluminum (Al), tin (Sn), indium (In), chromium (Cr), titanium (Ti), and combinations comprising at least one of the foregoing, such as nickel-gold. The nickel—gold p-type contact 16 may be alloyed or may contain a nickel-rich composition in contact with the p-GaN layer 12, and a gold-rich composition in contact with the nickel-rich layer.

An exemplary composition for the n-type contact 14 is titanium-aluminum. The titanium—aluminum n-type contact 14 can be alloyed or may contain a titanium-rich composition in contact with the n-GaN substrate 4 and an aluminum-rich composition in contact with the titanium-rich layer. The n-type contact 14 can also be formed using Al, scandium (Sc), Ti, zirconium (Zr), tantalum (Ta), tungsten (W), Ni, copper (Cu), silver (Ag), Au, Pd, hafnium (Hf), a rare earth metal, as well as combinations comprising at least one of the foregoing. The contacts 14, 16 can be deposited by various methods such as sputter-deposition and/or e-beam evaporation. The metal contacts 14, 16 performance as ohmic contacts can be enhanced if the contacts are annealed to a temperature of about 400° C. to about 1,200° C.

Figure 4:
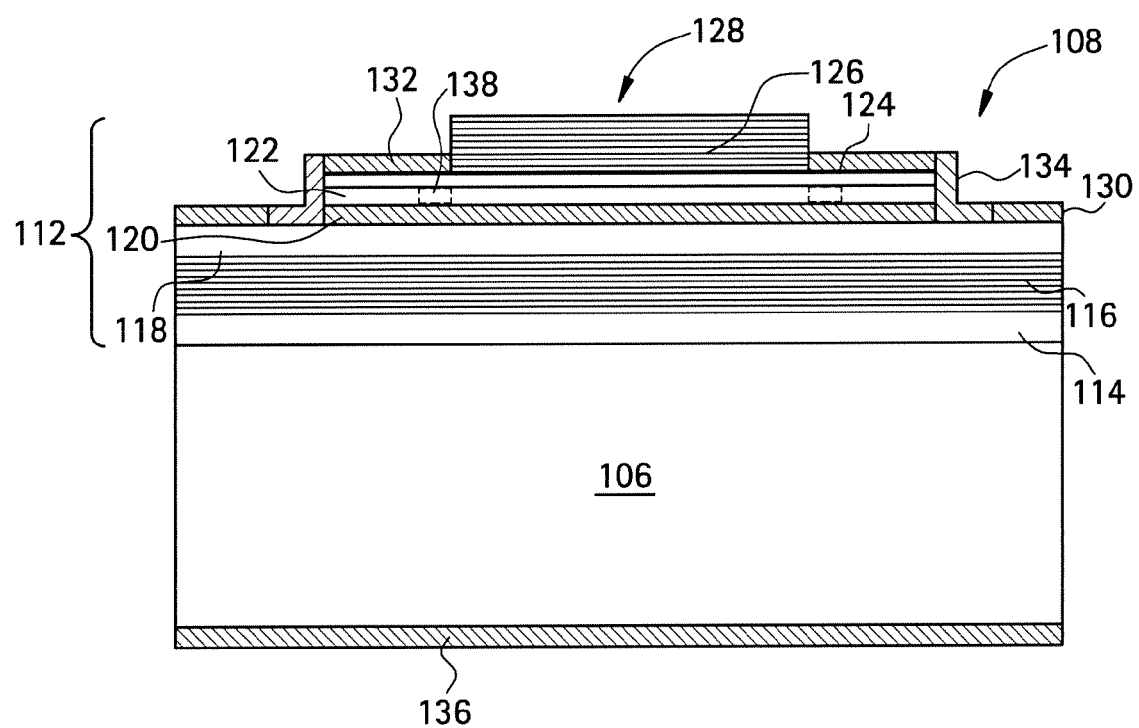
FIG. 4 illustrates the structure of another embodiment of an excitation source, a homoepitaxial resonant cavity LED.

In the exemplary resonant cavity light emitting device 108 shown in FIG. 4, a stack of Group III-nitride layers 112 grown on the gallium nitride substrate 106 includes in order of epitaxial deposition: an optional n⁺ GaN layer 114 a first mirror sub-stack 116 defining an n-type AlInGaN distributed Bragg reflector (DBR); an n-type GaAlInN cladding layer 118 an active region 120 including a GaAlInN multiple quantum well structure; a p-type GaAlInN cladding layer 122 a current spreading layer 124 and a second mirror sub-stack 126 defining a p-type AlInGaN distributed Bragg reflector (DBR).

Selected portions of upper epitaxially deposited layers 120, 122, 124, 126 are lithographically removed, optionally along with removal of a portion of the thickness of the n-GaAlInN cladding layer 118, to define a device mesa 128 that includes a portion of the second mirror sub-stack 126 as shown in FIG. 4. The removal of material to define the device mesa 128 forms trenches in the stack of Group III-nitride layers 112 that extend from an exposed surface of the stack 112 at least partway toward the single-crystal gallium nitride substrate 106. The trenches define laterally spaced islands of the active region 120. The device mesa 128 includes the islands of the active region 120. Because the single-crystal gallium nitride substrate 106 is substantially free of tilt boundaries, portions of the single-crystal gallium nitride substrate 106 that extend between the device mesas 128 contain substantially no edge dislocation arrays such as those that typically form at low-angle tilt boundaries.

Electrical contact is made by a frontside n-type electrode 130 contacting n-GaAlInN cladding layer 118, and by a frontside p-type electrode 132 contacting the current spreading layer 124. An insulating material 134, for example, $SiO_2$ or $SiN_x$, can be disposed between the electrodes 130, 132 to provide enhanced electrical isolation of the electrodes 130, 132 and/or to provide surface passivation. If the gallium nitride substrate 106 is doped n-type, the frontside n-type electrode 130 can be replaced by a backside n-type electrode 136 contacting the substrate 106. For surface emitting lasers the backside electrode 136 can be reflective, for example a Ti/Al metal stack. For a resonant cavity light emitting diode employing backside light emission, the backside electrode 136 can be substantially light transmissive (for example including substantially transparent indium tin oxide or a thin light-transmissive layer of metal), or, more specifically, for backside light emission the frontside n-electrode 130 can be employed.

Further device fabrication processing can be performed depending upon the desired operation of the resonant cavity light-emitting device 108. For example, to laterally define the optical cavity in a vertical cavity surface emitting laser, ion implanted regions 138 are suitably formed by ion implantation. To define a circular aperture, for example, the ion implanted regions 138 form a circle defining the laser aperture. Similarly, to define a rectangular aperture, the ion implanted regions 138 form a rectangle defining the laser aperture.

The thicknesses and compositions of the various layers of the stack 112 of Group III-nitride layers are selected based on the desired wavelength of operation and other operating characteristics. For example, the light emission wavelength of the active region 120 is determined by parameters such as thicknesses and compositions of the quantum wells and barriers. For example, for a 340 nm emission, a 2 nm $Al_{0.20}In_{0.04}Ga_{0.76}N$/7 nm $Al_{0.35}In_{0.07}Ga_{0.58}N$ quantum well is suitable, while for a 473 nm emission, a 3 nm $In_{0.15}Ga_{0.85}N$/6 nm $In_{0.05}Ga_{0.95}N$ quantum well is suitable. The precise compositions and layer thicknesses required to produce emission at a given wavelength can also depend on the details of atomic-layer ordering of the AlInGaN material. It is also contemplated to employ a single GaAlInN quantum well active region. Other quantum well structures can also be employed for light emission in the ultraviolet to blue wavelength range (for example, about 250 nm to about 500 nm) using literature values for parameters that may impact the emission wavelength, such as for bandgaps of the Group III-nitride layers, for electron and hole effective masses, for conduction and valence band offsets at interfaces, and so forth.

The active region 120 can be undoped, p-type, and/or n-type. For example, the quantum wells can be undoped while the barrier layers are undoped or doped n-type. Because the lower bandgap quantum well materials such as InN, $In_x Ga_{1-x}N$, and so forth, typically decompose at lower temperatures than does GaN, these layers are deposited at temperatures of about 650° C. to about 1,050° C.

Figure 6:
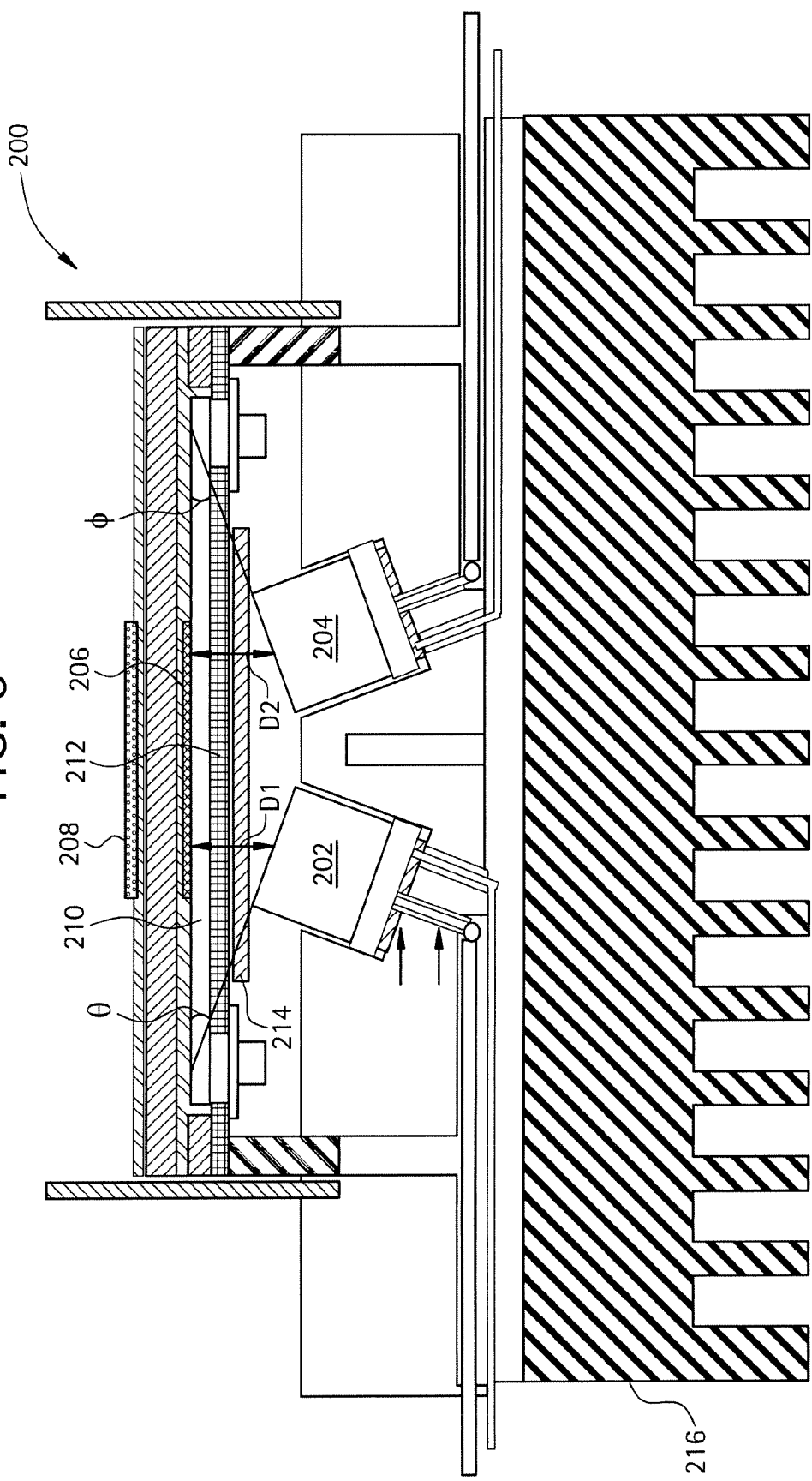
FIG. 6 is a schematic representation of another embodiment of a biosensor where recognition elements are bound to a substrate remote from the LED surface.

FIG. 6 schematically illustrates an embodiment of a DNA biosensor 200 comprising an LED 202 and a detector 204 in operable communication with recognition elements (not shown) on a surface of the substrate 206 opposite the heater 208. A microfluid chamber 210 is defined between the substrate 206 and a transparent wall (e.g., a glass wall) 212. On a side of the transparent wall 212, opposite the chamber 210, is a shutter 214. On a side of the biosensor, opposite the heater 208, is a heat exchanger (e.g., a cooler). The biosensor can further comprise a power source (not shown) such as a battery. Due to the design of this biosensor, e.g., having a low power consumption (e.g., can use a battery as the power supply), and the compact and rugged design, it is portable. For example, the power consumption can be less than or equal to about 200 watts, the size can be about 3 inches by about 5 inches, and the device is solid state (e.g., no moving parts). In one embodiment, the sensor comprises the n-electrode, n-GaN substrate, n-GaN or n-$Al_w Ga_{(1-w)}N$ cladding layer, an $In_x Ga_{(1-x)}N$ active layer, a p-$Al_y Ga_{(1-y)}N$ cladding layer, a p-GaN cladding layer, and a p-electrode, wherein $0 \leq x, y \leq 1$.

The LED 202 can be disposed at an angle θ, formed between the LED 202 and the substrate surface. The degree of the angle θ can be changed to adjust the sensitivity of the biosensor 200. For example, the angle θ can be about 15 degrees to about 40 degrees, or, more specifically, about 15 degrees to about 35 degrees, or, even more specifically, about 20 degrees to about 30 degrees. Additionally, to also attain a desired sensitivity, the distance D1 between the center of the LED face and the surface of the substrate 206. For example, the distance D1 can be up to about 30 millimeters (mm) or so, or, more specifically, about 5 mm to about 25 mm, or, even more specifically, about 5 mm to about 15 mm, and yet more specifically, about 10 mm to about 15 mm.

As with the LED 202, the detector 204 can be disposed at an angle Φ, formed between the detector 204 and the substrate surface. The degree of the angle Φ, which can be the same or different than the angle θ, can also be changed to adjust the sensitivity of the biosensor 200. For example, the angle Φ can be about 10 degrees to about 40 degrees, or, more specifically, about 15 degrees to about 30 degrees, or, even more specifically, about 20 degrees to about 30 degrees. The angle Φ can be different from the angle θ to, for example, reduce the detector noise (e.g., background noise induced by reflected and/or scattered light). Additionally, to also attain a desired sensitivity, the distance D2 between the center of the detector face and the wall 212. For example, the distance D2 can be up to about 30 millimeters (mm) or so, or, more specifically, about 10 mm to about 30 mm, or, even more specifically, about 15 mm to about 25 mm.

Obviously, modifications and alterations will occur to others upon reading and understanding the preceding, detailed description. For example, while the preceding description of homoepitaxial LEDs and resonant cavity devices is directed to vertical structures having top and bottom electrical contacts, an insulating or semi-insulating substrate could be used in conjunction with "side" contacts. Furthermore, GaN-based LEDs and resonant cavity devices are merely desirable excitation sources. For example, in an alternative embodiment the optical excitation source can be an AlN-based LED or a gas discharge such as a Hg-based discharge of the type used in fluorescent lamps.

As used herein, recognition elements include chemical, biochemical, and biological recognition elements such as antibody or nucleic acid probes. The recognition elements can be specific for the analyte. Being specific for the analyte means that the recognition elements prefer interacting with the analyte over substantially all other molecules present or potentially present in the sample. The fact that a recognition element might preferentially bind to some conceivable molecule other than the analyte does not by itself mean that the recognition element is not specific for the analyte. The recognition element need only be specific enough for the analyte that the recognition element remains practical and reasonably reliable for its intended purpose.

The recognition elements can be securely attached to surface(s) within the device that is exposed to the sample or analyte. Nucleic acid recognition elements are securely attached when they remain attached from about 0° C. to at least about 100° C. The recognition elements can be attached to a surface of the excitation source that is exposed to the sample, e.g., via covalent or ionic bonds. The recognition elements can be bound to a coating on the excitation source that facilitates their attachment, such as a sputter-deposited coating of gold, and/or they can be attached directly to the excitation source itself. In one embodiment, recognition elements are covalently or ionically bound to the interior or bottom of indentation(s), i.e., a channel(s), trough(s), depression(s) or the like, through channel(s), trough(s) or the like, on or in the surface of the excitation source, and through which sample or analyte can flow and bind to the recognition elements bound therein. The recognition elements can be bound to an optical filter, LED, or a photodetector within the biosensor, or can be disposed remote from, and in optical communication with, the LED, optical filter, and photodetector.

The recognition elements can be single stranded nucleic acids (e.g., double stranded nucleic acids (DNA), ribonucleic acid (RNA), and/or synthetic peptide nucleic acids (PNA)) that are bound via thiolated 5' ends to the surface of the excitation source that is exposed to the sample. To prevent or retard degradation of the bound recognition elements by depolymerization reactions in the testing solution, 2'-oxymethyl, fluorine, and/or an amino group can be added to the free ends of these recognition elements.

The device typically includes one or more types of luminophore(s) that absorb light from the excitation source and that first emit light, or that emit light with a different characteristic, when the recognition elements interact with the analyte. Although the art has defined luminophore more narrowly as the part of a material that emits light, and a chromophore as the part of a material that absorbs light, the term luminophore is used more broadly herein to serve as shorthand for the material(s) that both absorb and emit light. As such, luminophores include chromophores, fluorophores, phosphors, and chemilumophores. Herein, the term luminophore also includes any intercalator-type moiety or other agent necessary to alter the conformation of the luminophore, or otherwise affect its luminescence, when the recognition elements interact with the analyte.

The luminophore(s) can be kept separate from the device until the assay takes place, whereupon the luminophore(s) are placed into the sample solution and then bind either to the recognition element(s) and/or, to the complexes formed between the recognition elements and the analyte. Alternatively, the luminophores may initially be bound to the recognition elements or tethered to the same surface as the recognition elements, in which case the luminophores constitute an integral feature of the device embodiment per se.

In some embodiments, the luminophore(s) emit little or no light unless and until the recognition elements interact with the analyte. If the luminophores instead emit light with a different characteristic when the recognition elements interact with the analyte, the difference can be a difference in wavelength. Furthermore, when more than one type of luminophore is used, the luminophores can be chosen to have narrow emission bands; some fluorescent tags have broad emission bands that overlap, making multiplexing difficult. The luminophores can be chosen to have a band that is full width, half maximal ("FWHM"; i.e., the breadth of the band halfway to the peak intensity) of less than or equal to about 30 nm, or, more specifically, The luminescence of the luminophores depends on a conformational change resulting from interaction of the recognition elements with the analyte. For nucleic acid recognition elements and analyte, luminophores that are intercalating and/or groove binding dyes (such as SYBR Green I) have been found to be particularly useful. Upon binding to duplexes (e.g., DNA/RNA hybrids) formed between the recognition elements and the analyte, SYBR Green I exhibits intense luminescence at 522 nm, which can readily be detected by eye, CCD camera, and/or photodetector. Examples of other luminophores that can indicate duplex formation include: intercalator dyes; ruthenium polypyridyl dyes; cyanine dyes; dyes based on phenanthridine, acridine, indole, and/or imidazole structures; and other DNA/RNA stains such as silver stain.

Luminophores that indicate duplex formation can also be used with non-nucleic acid analytes and/or non-nucleic acid recognition elements, provided that nucleic acids are first attached to the non-nucleic acid analytes or non-nucleic acid recognition elements. For example, nucleic acids can be attached to aromatic hydrocarbons, carbohydrates, peptides, and/or proteins, such as antibodies, scFv, diabodies, FAB and other antibody-like molecules.

If the excitation source emits light (also referred to as the incident light or excitation light) at the same wavelength as the light emitted by the luminophores (also referred to as a second light or emission light), the former will constitute a background signal that reduces sensitivity. This background signal may be mitigated or eliminated by inserting optical filter(s) between the excitation source and the recognition elements to absorb wavelengths that might otherwise contribute to a background signal. Desirably, a filter can filter (i.e., block) light in a band gap that includes a peak intensity of the first light and excludes (e.g., allows transmission) of at least a portion of the second light.

Figure 7:
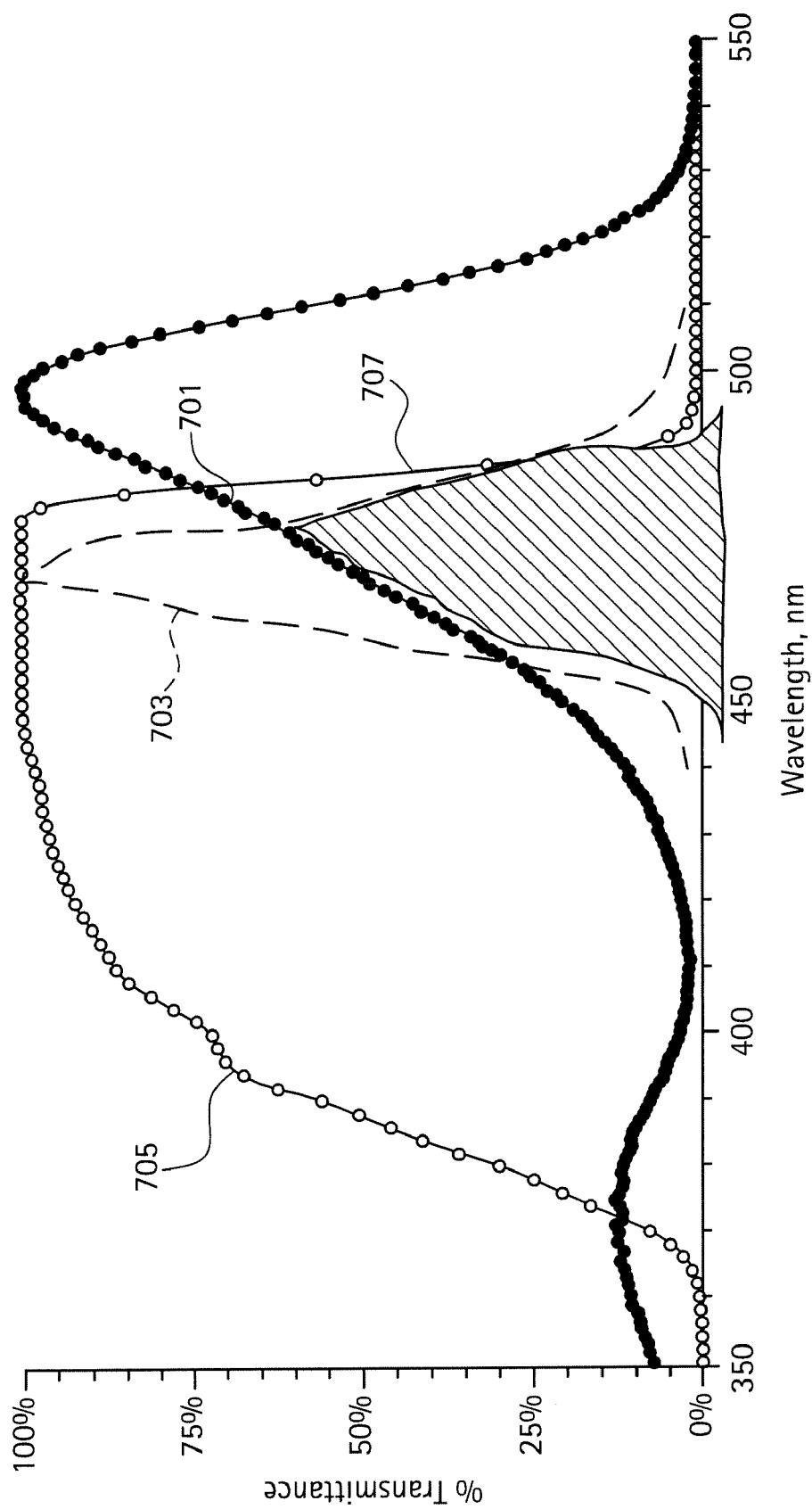
FIG. 7 is a graphical representation of wavelength versus intensity for luminophore excitation profile and the LED emission profile compared to the filter profile. (A portion of the FIG. 7 is from *The Handbook—A Guide to Fluorescent Probes and Labeling Technologies. Invitrogen*, $10^{th}$ Edition, Chapter 8, FIG. 8.77.
Figure 8:
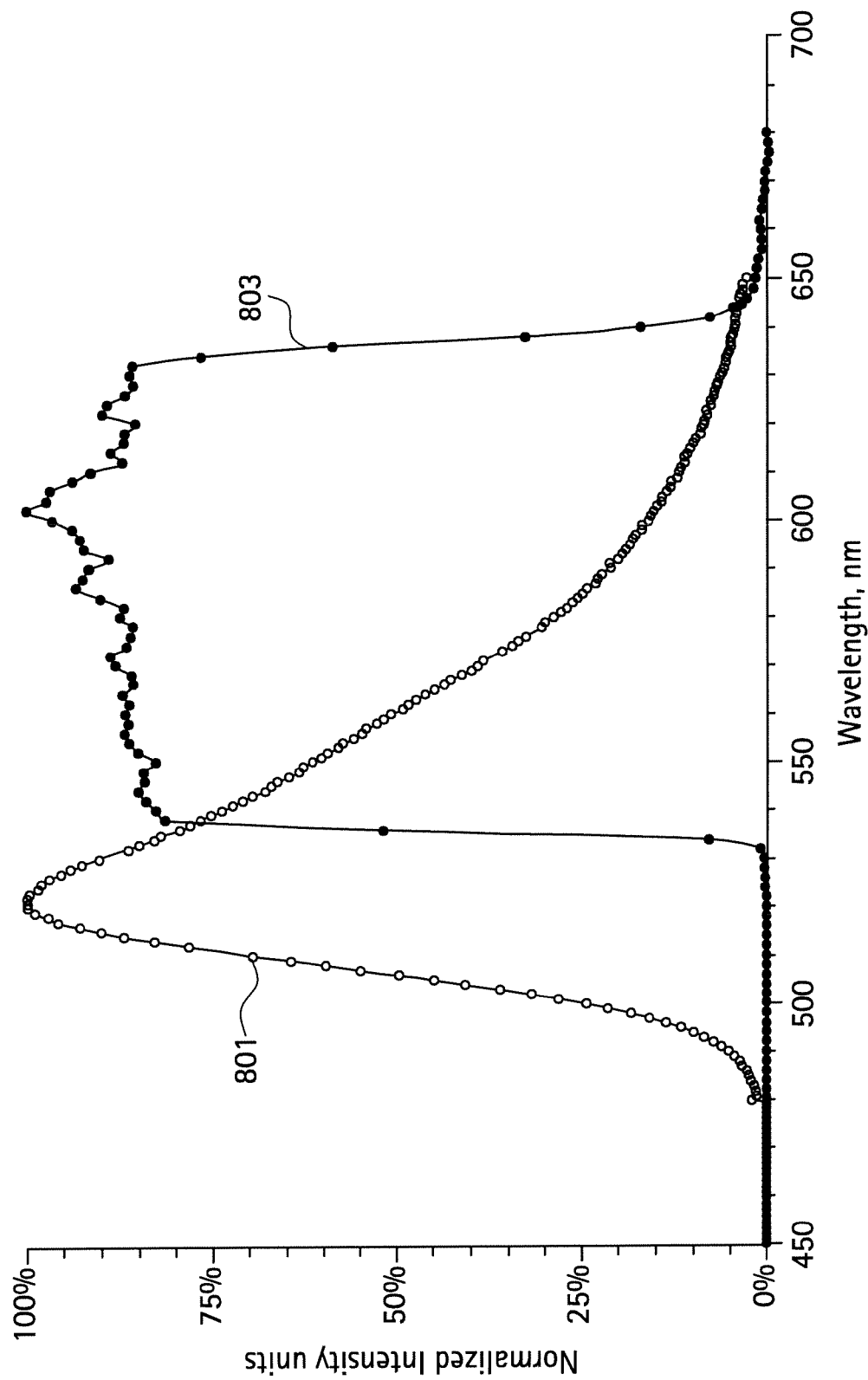
FIG. 8 is a graphical representation of wavelength versus intensity for luminophore emission profile compared to the emission filter profile as measured in the preferred embodiment under zero incident light angle.

As can be seen in FIG. 7, the excitation filter has a substantially vertical (e.g., a change in transmission from greater than 50% to less than 10% in a wavelength span of less than or equal to about 10 nm) filtration profile (portion 707 of line 705) such that it inhibits the transmission of light below 500 nm while allowing the transmission of the light emitted by the luminophores when the recognition elements react with the analytes. As can be seen, the light emitted by the luminophores peaks at greater than 500 nm (line 701; emission profile)) and can therefore be detected and differentiated from the light incident upon the recognition elements and substrate from the LED (line 703; excitation profile), e.g. at wavelengths of greater than 500 nm such that the analyte can be detected. The excitation filter profile, line 705, is a transmittance as measured under zero degree incident light illumination. Similarly, in FIG. 8, the luminophores' emission peaks at about 515 nm (line 801; emission profile), and the emission filter (e.g., the filter on the detector), has a profile that begins filtering at about 525 nm (line 803; emission filter profile). The emission filter profile, line 803, is a filter transmittance as measured under epi incident angle illumination. Hence, FIGS. 7 and 8 illustrate that emission light at about 505 nm to about 520 nm (e.g., the luminophore emission peak), can be detected, with noise from other light (e.g., the LED excitation light), filtered out.

Figure 9:
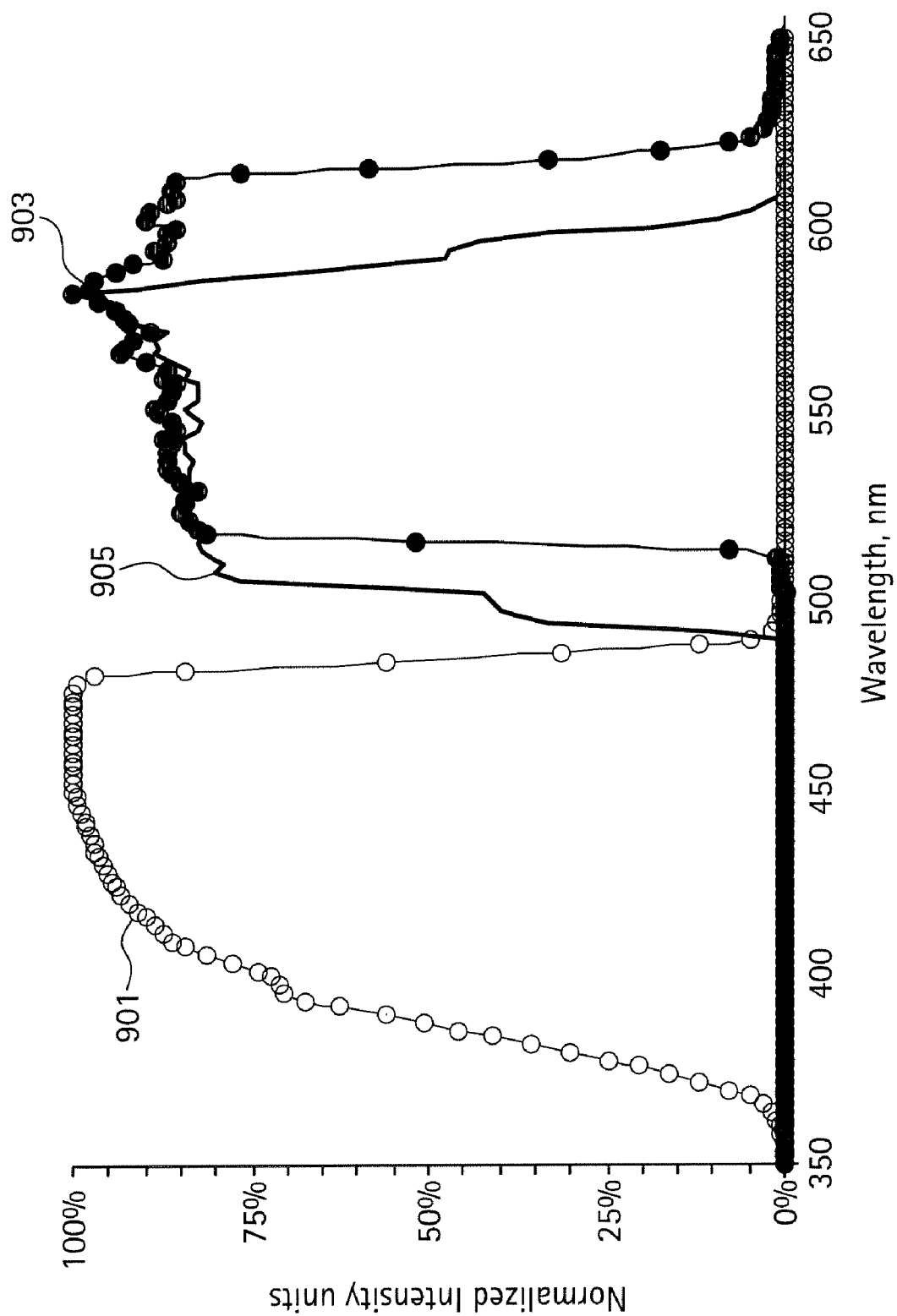
FIG. 9 is a graphical representation of the excitation filter profile at zero degrees (Φ), and the emission filter profile at zero and 40 degrees (θ).
Figure 10:
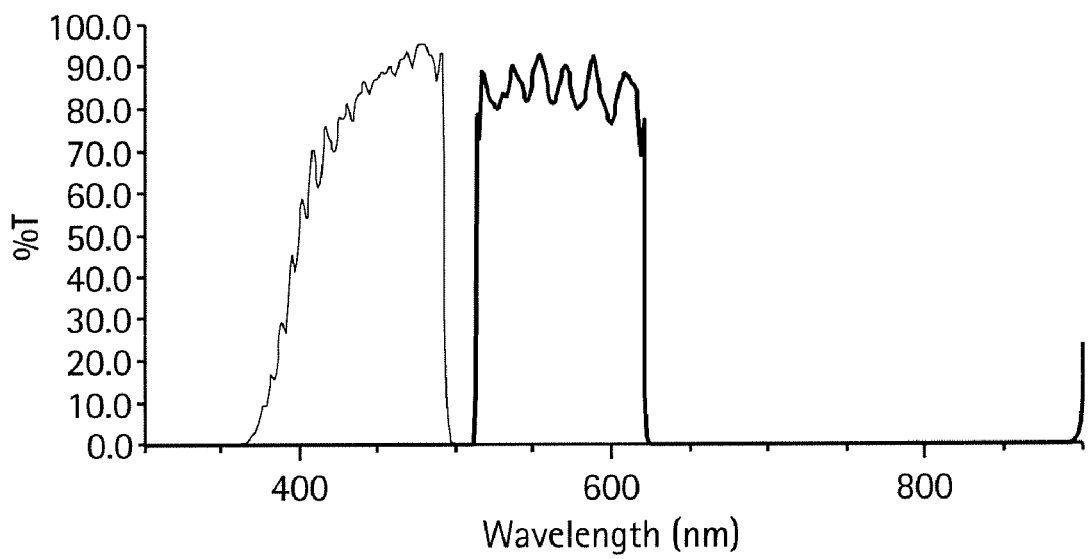
FIG. 10 is graphical filter performance model of wavelength versus percent transmission for band-pass excitation and an emission filter with the performance shown for an incident light angle of 90°.
Figure 11:
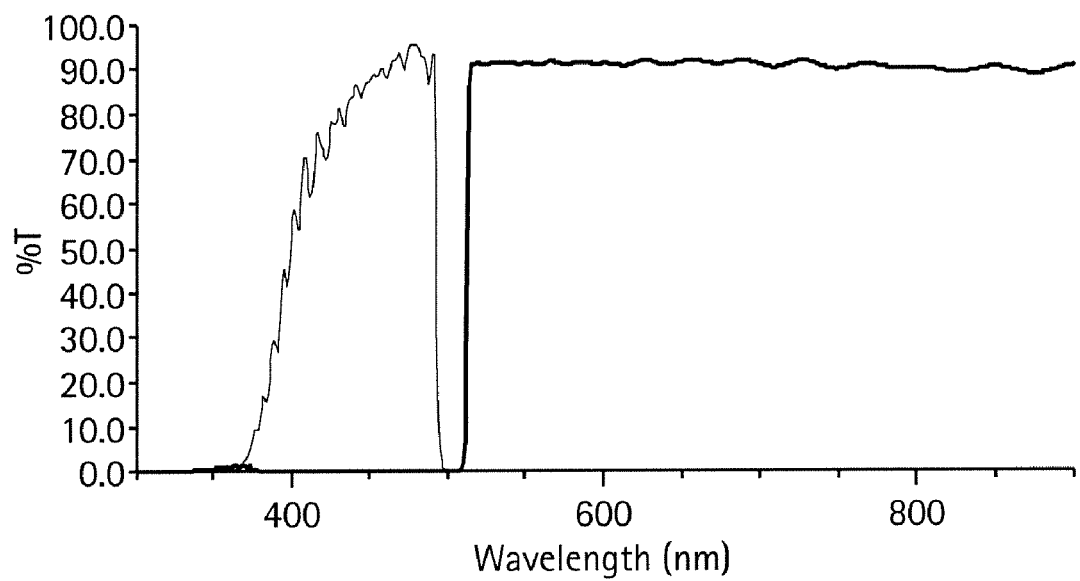
FIG. 11 is graphical filter performance model of wavelength versus percent transmission for a band-pass excitation and a long-pass emission filter with the performance shown for an incident light angle of 90°.

As can be seen from FIG. 9, the specific filtration band of the filter can be affected by the angle of the filter with respect to the substrate comprising the recognition elements (i.e., θ, Φ). The filters can be located between the LED and detector, and/or the emission filter can be located (e.g., inserted) between the LED and the chamber, and the excitation filter can be located between the detector and the chamber. Line 901 is an excitation filter transmittance as measured under epi incident angle illumination, while lines 903 and 905 are emission filter transmittance as measured under incident angle illumination of zero and 40 degrees (θ), respectively. FIGS. 10 and 11 show performance models of wavelength versus percent transmission for some filters at an incident light angle of 90°.

In various embodiments, the light emitted by the luminophores when the recognition elements interact with the analyte can be detected with the naked eye, a microscope, and/or a photodetector. For example, detection of 10,000 different biomolecules simultaneously may be achieved by deposition of a 100×100 array of distinct recognition elements onto the surface of an LED, and may be detected either by scanning under a microscope or by coupling the light to a suitable photodetector comprising a 100×100 array of detector elements.

The device can be used to qualitatively or quantitatively detect or monitor numerous types of analyte molecules and the substances, organisms and processes of interest signified by the presence of such analyte molecules. The analytes include biomolecules such as nucleic acids, proteins, and carbohydrates. Detection of ribosomal RNA is particularly advantageous because of the much greater quantity in cells of ribosomal RNA relative to DNA. Other nucleic acids which can be detected include locked nucleic acid (LNA) and protein nucleic acid (PNA). The device can also be used to qualitatively or quantitatively detect or monitor anions, cations, organic molecules (such as drugs and pesticides), inorganic molecules (such as $O_2$), and so forth.

The analyte solution can be obtained by lysing cells and then denaturing the analyte DNA at 95° C. The resulting ssDNA can be cut with restriction enzymes to form the target ssDNA. The device is also applicable to DNA drawn directly from numerous types of samples including, for example, blood, urine, tissue, sputum, water, soil, foods, beverages, bodily fluids, ambient air, and so forth. In other words, the device can be employed in diverse areas such as medical diagnostics, genomics, biohazard monitoring, and others.

The device can be used for qualitative identification of an analyte (i.e., to determine whether the analyte is present or not), and/or to quantify the concentration of analyte in the test solution. The binding constants of the recognition elements, (e.g., ssDNA, to the analyte, e.g., complementary ssDNA), are typically quite high. Analyte molecules in the environment of the recognition elements will therefore tend to bind irreversibly to the recognition elements at a rate that is characteristic of diffusion in the local medium until they are depleted from the medium. The concentration of analyte molecules can therefore be determined from the binding kinetics; analytes at a higher concentration will saturate the recognition elements more rapidly than analytes at a lower concentration.

The analyte can comprise a nucleic acid that differs at a single base position from non-analyte nucleic acids potentially present in the sample. Such an embodiment can be used to detect a single nucleotide polymorphism (SNP). In other embodiments, detecting the analyte qualitatively or quantitatively indicates: the presence of a single molecule of interest; the presence or concentration of a protein with a tertiary or quaternary structure of interest; denaturation of a nucleic acid duplex of interest; whether, or the extent to which, a dye of interest is binding to a molecule of interest; whether, or the extent to which, acid/base or redox reactions are occurring in a sample; the presence of, or a predisposition to, diseases such as cancer, tumors, leukemia, diabetes and neurodegenerative disorders; or the presence or concentration of hairpins, cruciforms, or Z-DNA; as well as combinations comprising at least one of the foregoing. Certain embodiments of the device can be used for: continuous and real-time or near real-time detection of microbial contamination or growth; genotype characterization; detection of mutations; monitoring gene expression; or monitoring binding of a dye to a molecule of interest; as well as combinations comprising at least one of the foregoing.

EXAMPLE I

An air-exposed GaN LED was sputter-coated with a thin layer of gold. Single stranded DNA oligonucleotides with thiolated 5' ends were attached to the gold-coated surface. The LED was placed in contact with a solution containing a population of complementary ssDNA, a luminescent intercalating dye, and a buffer. After hybridization to form a DNA duplex, the device emitted green light for 30 seconds that was visible to the naked eye. The amount of DNA on the substrate was determined to be 110 fmol ($10^{-15}$ moles), or 1.3 nanograms (ng) of ssDNA. In the absence of complementary ssDNA, the device emitted blue light. The device also emitted blue light in the presence of non-complementary ssDNA.

Figure 5:
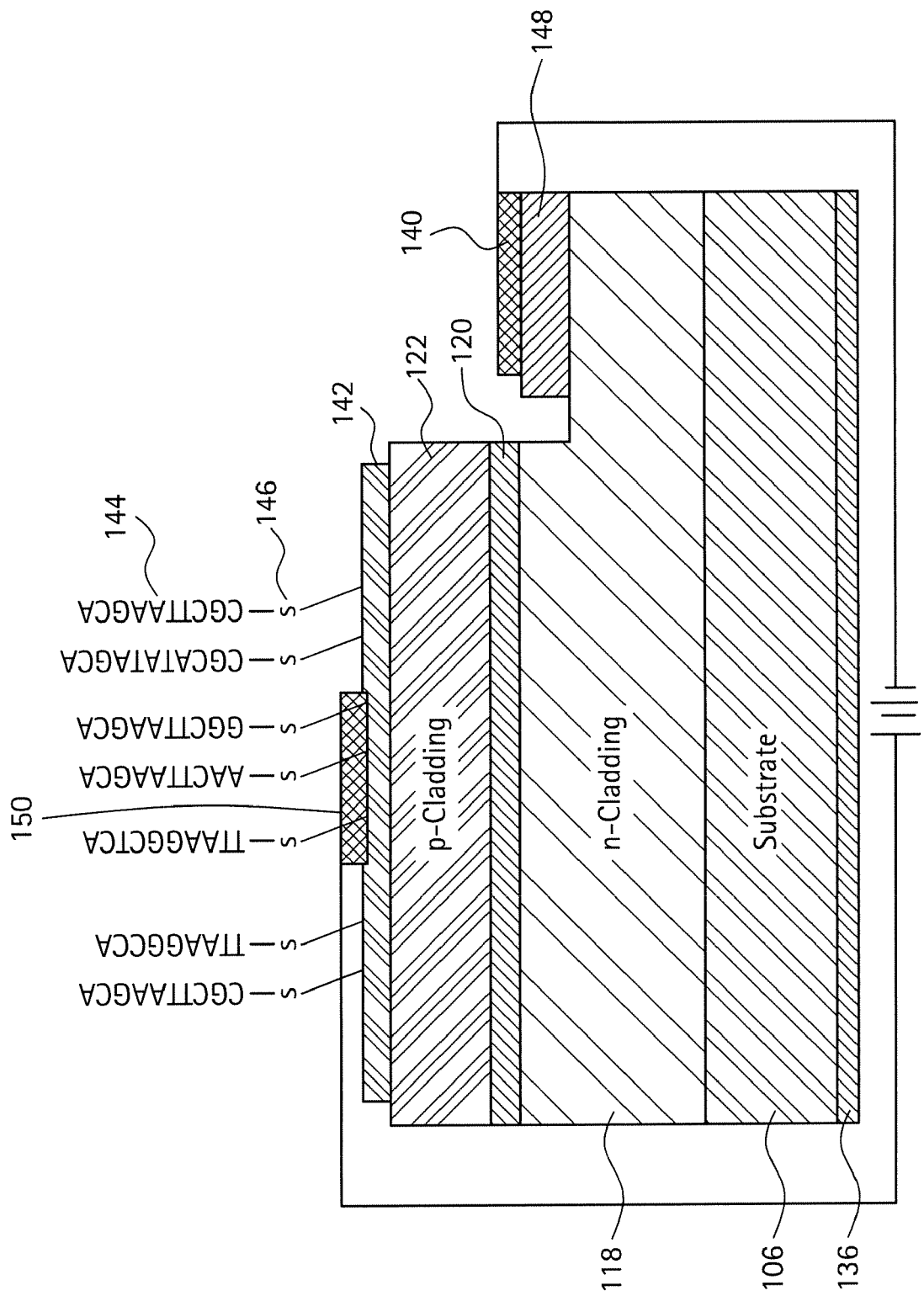
FIG. 5 shows an embodiment of a device with a GaN LED with 5' thiolated ssDNA molecules covalently bound to the LED surface, which has been sputter coated with gold.

FIG. 5 depicts a simplified view of an embodiment of the DNA sensor. The nucleic acid recognition elements 144 are bound via their thiolated 5' ends 146 to p-type electrode 142, which has a gold-coated surface. Disposed over part of p-type electrode 142 is bond pad 150. The recognition element molecules 144 hybridize with the analyte, forming dsDNA. The luminescent dye (not shown) binds to the dsDNA, generating luminescence. When substrate 106 is conductive, the device employs a backside n-type electrode 136. When substrate 106 is insulated, the device employs an n-type side electrode 148 (with bond pad 140). In Example I, the device included an insulated substrate 106 and employed an n-type side electrode 148. Other features of the device are described here with reference to FIG. 4, where like numerals denote like features.

The recognition elements 144 depicted on FIG. 5 (cgcttaagca, ttaaggcca, ttaaggctca, aacttaagca, ggcttaagca, cgcatatagc, etc.) can be single stranded DNA N-mer size oligonucleotides designed to detect an organism of interest and/or cDNA fragments produced by an organism of interest.

The terms "first," "second," and the like herein do not denote any order or importance, but rather are used to distinguish one element from another, and the terms "a" and "an" herein do not denote a limitation of quantity, but rather denote the presence of at least one of the referenced items. The modifier "about" used in connection with a quantity is inclusive of the stated value and has the meaning dictated by the context (e.g., includes the degree of error associated with measurement of the particular quantity). "Combination" is inclusive of blends, mixtures, alloys, reaction products, and the like. Furthermore, all ranges disclosed herein are inclusive and combinable (e.g., ranges of "up to about 25 weight percent (wt %), with about 5 wt % to about 20 wt % desired, and about 10 wt % to about 15 wt % more desired," is inclusive of the endpoints and all intermediate values of the ranges, e.g., "about 5 wt % to about 25 wt %, about 5 wt % to about 15 wt %," etc.). The suffix "(s)" as used herein is intended to include both the singular and the plural of the term that it modifies, thereby including at least one of that term (e.g., the colorant(s) includes at least one colorants). "Group" refers to the groups in the Periodic Table of the Elements. Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through carbon of the carbonyl group. As used herein, particle size is an average size as measured along the major axis (i.e., the longest axis) of the particle.

While the invention has been described with reference to several embodiments thereof, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A sensor for detecting an analyte, comprising:
   a substrate;
   recognition elements specific for the analyte, wherein the recognition elements are tethered to the substrate such that the recognition elements can be exposed to a sample;
   an excitation source for emitting a first light to excite a luminophore to emit a second light when the recognition elements interact with the analyte, wherein the first light has a first light peak intensity at a first wavelength, and wherein the second light has a second light band;
   a detector capable of detecting the second light emitted by the luminophore;
   a chamber located between the substrate and the excitation source and between the substrate and the detector, wherein when the analyte is introduced to the chamber it can contact the recognition elements; and
   an emission filter located between the detector and the chamber capable of filtering in a band gap that includes the first light peak intensity and excludes at least a portion of the second light band.

2. The sensor of claim 1, wherein the detector is at an angle $\Phi$ formed between the detector and the substrate surface of about 0 degrees to about 30 degrees.

3. The sensor of claim 2, wherein the angle $\Phi$ is about 15 degrees to about 30 degrees.

4. The sensor of claim 2, wherein the angle $\Phi$ is about 20 degrees to about 30 degrees.

5. The sensor of claim 1, wherein the excitation source is at an angle $\theta$ formed between the excitation source and the substrate surface of about 15 degrees to about 35 degrees.

6. The sensor of claim 5, wherein the angle θ is about 15 degrees to about 30 degrees.

7. The sensor of claim 5, wherein the detector is at an angle Φ formed between the detector and the substrate surface of about 0 degrees to about 30 degrees, and wherein the angle θ is different from the angle Φ.

8. The sensor of claim 1, wherein a center surface of the excitation source nearest the chamber is located a first distance from the substrate, and a center surface of the detector nearest the chamber is located a second distance to the substrate, and wherein the first distance and the second distance are less than or equal to about 30 mm.

9. The sensor of claim 8, wherein the first distance is about 5 mm to about 15 mm.

10. The sensor of claim 9, wherein the second distance is about 15 mm to about 25 mm.

11. The sensor of claim 1, wherein the emission filter has a substantially vertical filtration profile.

12. The sensor of claim 1, wherein the excitation source is GaN-based.

13. The sensor of claim 1, wherein the recognition elements are tethered to the substrate via covalent or ionic bonds.

14. The sensor of claim 13, where the recognition elements are tethered to a three-dimensional hydrogel matrix.

15. The sensor of claim 1, wherein the recognition elements comprise a nucleic acid.

16. The sensor of claim 15, wherein the recognition elements comprise a single stranded nucleic acid that is bound to the substrate via a thiolated 5'end of the recognition elements.

17. The sensor of claim 1, wherein the luminophore is bound to the recognition elements before the recognition elements are exposed to the sample.

18. A sensor for detecting an analyte, comprising:
a substrate;
recognition elements specific for the analyte, wherein the recognition elements are tethered to the substrate such that the recognition elements can be exposed to a sample;
an excitation source for emitting to excite a luminophore to emit a second light when the recognition elements interact with the analyte, wherein the first light has a first light peak intensity at a first wavelength, and wherein the second light has a second light band;
a detector capable of detecting the second light emitted by the luminophore;
a chamber located between the substrate and the excitation source and between the substrate and the detector, wherein, when the analyte is introduced to the chamber it can contact the recognition elements;
an emission filter located between the detector and the chamber capable of filtering in a band gap that includes the first light peak intensity and excludes at least a portion of the second light band; and
an excitation filter located between the excitation source and the chamber capable of filtering in a band gap that includes the second light peak intensity and excludes at least a portion of the first light band.

19. A method for sensing an analyte, comprising:
introducing a sample to a chamber in a sensor, wherein the sensor comprises a substrate;
recognition elements specific for the analyte, wherein the recognition elements are tethered to the substrate;
an excitation source that for emitting a first light having a first light peak intensity at a first light wavelength;
a detector capable of detecting a second light having a second light band;
the chamber located between the substrate and the excitation source and between the substrate and the detector; and
a luminophore located in the chamber;
exposing the recognition elements to the sample;
emitting the first light to excite the luminophore to emit the second light if the analyte is present in the sample; and
determining if the second light is emitted.

20. The method of claim 19, wherein detecting if the second light is emitted further comprises filtering light that enters the detector such that at least a portion of the second light band can enter the detector while the first light wavelength is blocked.

21. The sensor of claim 1, wherein a surface of the excitation source includes a coating comprising gold.

* * * * *

UNITED STATES PATENT AND TRADEMARK OFFICE
CERTIFICATE OF CORRECTION

PATENT NO. : 7,615,780 B2
APPLICATION NO. : 11/427544
DATED : November 10, 2009
INVENTOR(S) : Tysoe et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 496 days.

Signed and Sealed this

Nineteenth Day of October, 2010

David J. Kappos
*Director of the United States Patent and Trademark Office*

SEQUENCE LISTING

```
<160> NUMBER OF SEQ ID NOS: 7

<210> SEQ ID NO 1
<211> LENGTH: 10
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 1
cgcttaagca                                                          10

<210> SEQ ID NO 2
<211> LENGTH: 9
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 2 ttaaggcca                                                            9

<210> SEQ ID NO 3
<211> LENGTH: 10
<212> TYPE: DNA
<213> ORGANISM: Unknown
<220> FEATURE:
<223> OTHER INFORMATION: single strand sensor for one or more analytes
```

-continued or produced by an organism of interest

<400> SEQUENCE: 3
ttaaggctca                                                          10

<210> SEQ ID NO 4
<211> LENGTH: 10
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 4
aacttaagca                                                          10

<210> SEQ ID NO 5
<211> LENGTH: 10
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 5
ggcttaagca                                                          10

<210> SEQ ID NO 6
<211> LENGTH: 11
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 6
cgcatatagc a                                                        11

<210> SEQ ID NO 7
<211> LENGTH: 10
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 7
cgcttaagca                                                          10